(12) United States Patent
Blanchard et al.

(10) Patent No.: US 11,114,553 B2
(45) Date of Patent: Sep. 7, 2021

(54) LATERAL INSULATED GATE TURN-OFF DEVICE WITH INDUCED EMITTER

(71) Applicant: Pakal Technologies, Inc., San Francisco, CA (US)

(72) Inventors: Richard A. Blanchard, Los Altos, CA (US); Vladimir Rodov, Seattle, WA (US)

(73) Assignee: Pakal Technologies, Inc., San Francisco, CA (US)

( * ) Notice: Subject to any disclaimer, the term of this patent is extended or adjusted under 35 U.S.C. 154(b) by 0 days.

(21) Appl. No.: 16/815,856

(22) Filed: Mar. 11, 2020

(65) Prior Publication Data

US 2020/0312987 A1  Oct. 1, 2020

Related U.S. Application Data

(60) Provisional application No. 62/823,192, filed on Mar. 25, 2019.

(51) Int. Cl.
| | |
|---|---|
| *H01L 29/745* | (2006.01) |
| *H01L 29/749* | (2006.01) |
| *H01L 29/66* | (2006.01) |
| *H01L 29/10* | (2006.01) |
| *H01L 29/423* | (2006.01) |

(52) U.S. Cl.
CPC ........ *H01L 29/745* (2013.01); *H01L 29/1095* (2013.01); *H01L 29/42308* (2013.01); *H01L 29/66363* (2013.01); *H01L 29/749* (2013.01)

(58) Field of Classification Search
CPC ................ H01L 29/745; H01L 29/749; H01L 29/66363; H01L 29/66325; H01L 29/1095; H01L 29/42308; H01L 29/7393; H01L 29/7394; H01L 29/7436; H01L 29/4236; H01L 2924/13055
See application file for complete search history.

(56) References Cited

U.S. PATENT DOCUMENTS

| | | | | | |
|---|---|---|---|---|---|
| 5,828,101 | A | * | 10/1998 | Endo ................... | H01L 29/7825 257/330 |
| 8,937,502 | B2 | * | 1/2015 | Blanchard .......... | H03K 17/0403 327/376 |

* cited by examiner

*Primary Examiner* — Jose R Diaz
(74) *Attorney, Agent, or Firm* — Patent Law Group; Brian D. Ogonowsky

(57) ABSTRACT

A lateral insulated gate turn-off device includes an n-drift layer, a p-well formed in the n– drift layer, a shallow n+ type region formed in the well, a shallow p+ type region formed in the well, a cathode electrode shorting the n+ type region to the p+ type region, a trenched first gate extending through the n+ type region and into the well, a p+ type anode region laterally spaced from the well, an anode electrode electrically contacting the p+ type anode region, and a trenched second gate extending from the p+ type anode region into the n-drift layer. For turning the device on, a positive voltage is applied to the first gate the reduce the base width of the npn transistor, and a negative voltage is applied to the second gate to effectively extend the p+ emitter of the pnp transistor further into the n-drift layer to improve performance.

20 Claims, 4 Drawing Sheets

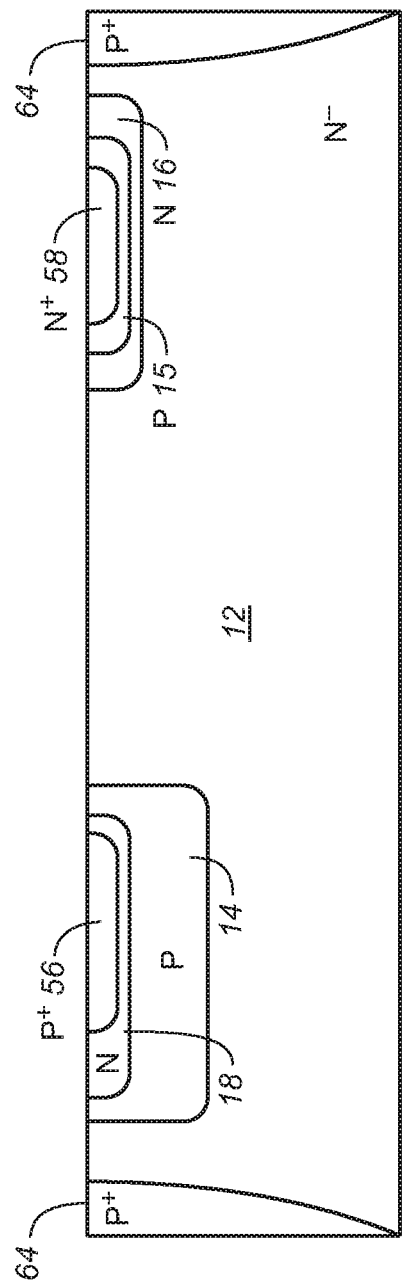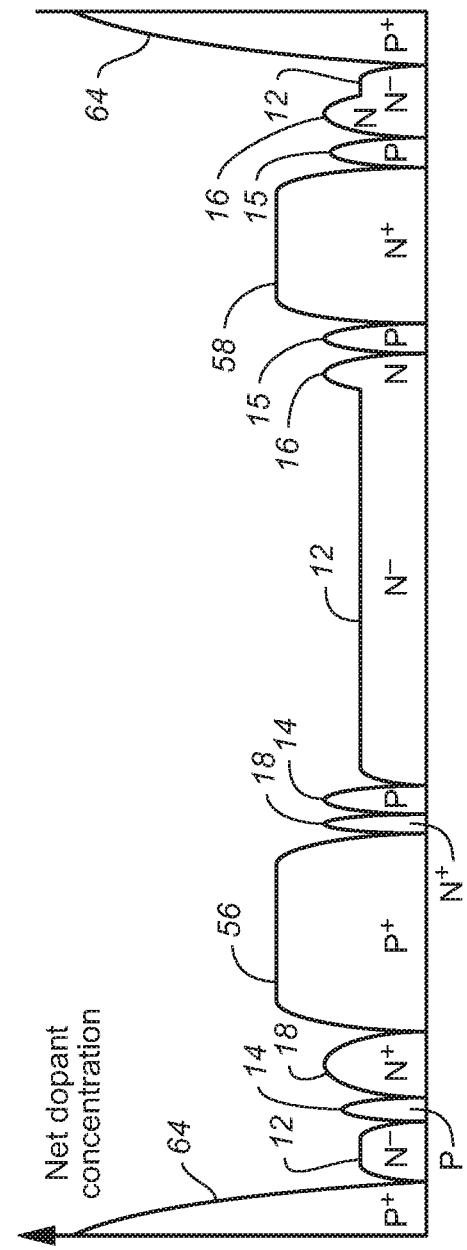

LATERAL INSULATED GATE TURN-OFF DEVICE WITH INDUCED EMITTER

CROSS-REFERENCE TO RELATED APPLICATIONS

This application is based on provisional application Ser. No. 62/823,192, filed Mar. 25, 2019, by Vladimir Rodov et al., assigned to the present assignee and incorporated herein by reference.

FIELD OF THE INVENTION

This invention relates to insulated gate turn-off (IGTOs) devices and, more particularly, to a lateral IGTO with trenched gates.

BACKGROUND

Applicant's U.S. Pat. No. 7,705,368 describes a vertical insulated gate turn-off (IGTO) device having a vertical npnp semiconductor layered structure. This forms vertical npn and pnp bipolar transistors. A cathode electrode is formed on the top n-type layer, and an anode electrode is formed on the bottom p-type layer. Trenched gates (one per vertical cell) extend a certain depth into the upper p-type layer base (a p-well) of the npn transistor. When a forward bias voltage is applied between the cathode and anode of the device, applying a positive voltage to the gates inverts a portion of the p-type layer base to effectively reduce the npn transistor base width and increase the beta of the npn transistor. At this point, the product of the betas of the npn and pnp transistors is greater than one. The initially small diffusion current is then rapidly amplified by feedback, causing "breakover," where both the npn and pnp transistors become fully conducting. To turn off the device, the gate voltage is removed to increase the base width, so the product of the betas is less than one.

Such vertical IGTO devices are more efficient than insulated gate bipolar transistors (IGBTs) and can conduct higher currents due to having a higher current density when on.

The vertical IGTO device can handle high voltages and currents since the device can be thick without each IGTO cell using up much surface real estate. Many cells can be formed in parallel by forming an array of trenched gates in the common upper p-type layer (p-well).

One problem with such a vertical IGTO device is that the distance between the bottom of the trenched gate and the bottom of the p-type layer (p-well) directly affects the turn-on voltage. It is very difficult to precisely control the depths of the trenches, so the turn-on voltage varies from lot to lot. Further, the p-type layer must be fairly deep, and therefore the doping will typically be in-situ doping while the p-type layer is formed. The turn-on voltage is also affected by the doping of the p-type layer. It would be difficult to create a uniformly doped, deep p-type layer using implantation. Further, forming deep trenches for a high voltage device is very time-consuming and therefore expensive. Still further, it is difficult to form other circuitry on the same die as the vertical IGTO device since the IGTO device requires a topside cathode and a bottomside anode.

Applicant's U.S. Pat. No. 8,937,502, incorporated herein by reference, describes a lateral version of the IGTO device, where the cathode, anode, and gate electrodes are all formed on the top surface of the device. This lateral device is easier to fabricate with well-controlled turn-on characteristics. Also, it is possible to integrate other components on the same chip with one or more lateral IGTO devices.

Since the present invention is a modification of the lateral IGTO device described in U.S. Pat. No. 8,937,502, one embodiment of that prior art device is described in detail below, and the description of the present invention will focus on the modified features, with the understanding that other aspects of the present invention may be the same as the IGTO device described in U.S. Pat. No. 8,937,502. The below description of prior art FIGS. 1-3 is basically copied from U.S. Pat. No. 8,937,502.

Prior art FIG. 1 is a simplified top down view of an IGTO device 10 described in U.S. Pat. No. 8,937,502. The device 10 is a 3-terminal silicon-based die. FIG. 2 is a cross-sectional view along line 2-2 in FIG. 1, and FIG. 3 is a cross-sectional view along line 3-3 in FIG. 1. The sizes of the features and number of gates will depend on the desired breakdown voltage and maximum current to be conducted.

The starting substrate will typically be silicon, and the substrate may even have an insulating layer since the current is conducted laterally rather than vertically. In the examples, the various features are formed in an n-drift layer 12. This n− drift layer 12 may be the actual substrate or a doped epitaxial layer on the substrate. The n− drift layer 12 may even be formed over an insulating layer. The selection of the n− drift layer 12 may depend on whether additional circuitry is to be formed in the die. For example, the n− drift layer 12 may be electrically isolated from other circuitry formed in the same die by surrounding the n− drift layer 12 with a p+ type sinker extending to a p-type substrate, or surrounding the n− drift layer 12 with a trench extending to the p-type substrate. Alternatively, the n− drift layer 12 may be a doped n-well in a p-type substrate.

If the n− drift layer 12 is grown over a p-type substrate, the n− drift layer 12 has a preferred thickness greater than 10 microns. Its doping concentration is between about $5 \times 10^{13}$ to $5 \times 10^{14}$ cm$^{-3}$. This dopant concentration can be obtained by in-situ doping during epitaxial growth.

A p-type well 14 (hereinafter a p-well) is defined by a mask and formed by implanting dopants. The peak doping concentration in the p-well 14 can be, for example, $10^{16}$-$10^{18}$ cm$^{-3}$. The depth of the p-well 14 will typically be between 0.1-10 microns. The p− well 14 is wholly contained in the n-drift layer 12.

Simultaneously with forming the p-well 14, a p-type anode region 15 is formed. The spacing between the p-well 14 and the p-type anode region 15 depends on the desired breakdown voltage of the device. Alternatively, the p-type anode region 15 may be formed by a separate implantation step.

An optional n-type buffer well 16 may be implanted prior to the formation of the p-well 14 and p-type anode region 15 and has a dopant concentration between about $10^{17}$ to $5 \times 10^{17}$ cm$^{-3}$. In addition to reducing the electric field, the n-type buffer well 16 reduces the injection of holes into the n− drift layer 12 from the p-type anode region 15 when the device is on, since the n-type buffer well 16 has a dopant concentration higher than that of the n− drift layer 12.

Another masked implant is then used to create a shallow n+ type region 18 in the p-well 14. The n+ type region 18 has a depth of, for example, 0.05-1.0 microns. In one embodiment, the n+ type region 18 is formed by an implant of arsenic or phosphorus at an energy of 10-150 keV and an area dose of $5 \times 10^{13}$ to $10^{16}$ cm$^{-2}$, to create a dopant concentration exceeding $10^{19}$ cm$^{-3}$.

Another masked implant is then used to create distributed p+ type regions 20 along an edge of the n+ type region 18 for the purpose of creating ohmic contact between a metal cathode electrode 28 and the p-well 14. When a sufficient current flows through the p-well 14, the resistance between the right side of the p-well 14 and the p+ type regions 20 near the left side of the p-well 14 causes the differential voltage to exceed 0.6 volts to forward bias the emitter-base of the npn transistor to turn it on. The p-type implant may also further dope the p-type anode region 15 to make it p+ type so that ohmic contact may be made to a metal anode electrode 30.

The number and locations of p+ type regions 20 in the p-well 14, which determine the extent of the shorting of the n+ type region 18 to the p-well 14, affect the characteristics of the device and may be adjusted to achieve the desired characteristics. The optimal design may be determined by simulation.

Either before or after the implant which forms the shallow n+ type region 18, trenches are etched in the p-well 14. In one embodiment, the trenches can be, for example, 1-10 microns deep, and as narrow as practical to maximize the effective area of the n+ type region 18, which serves as the emitter for the npn transistor. The trenches do not extend into the n− drift layer 12.

After the trenches are etched, gate oxide 22 is grown on the sidewalls and bottoms of the trenches to, for example, 0.05-0.15 microns thick. Conductive material, such as heavily doped polysilicon, then fills the trenches and is planarized to form the trenched gates 24. The gates 24 are electrically connected together.

A dielectric mask layer is then formed and patterned for the metallization of the surface. Various metal layers are then deposited to form the gate electrode 26, the cathode electrode 28, and the anode electrode 30. The cathode electrode 28 shorts the n+ type region 18 to the p-well 18 via the p+ type regions 20.

The p-well 14 acts as a base for the npn bipolar transistor formed by the n+ type region 18 (emitter), p-well 14 (base), and n− drift layer 12 (collector). When the gates 24 are shorted to the cathode electrode 28, or otherwise biased below a turn-off threshold voltage, the effective base width (W1 in FIG. 1) is wide (or long), resulting in a low beta for the npn transistor. The p− well 14, the n− drift layer 12, and the p+ type anode region 15 form a pnp bipolar transistor. With a forward bias voltage applied to the anode and cathode electrodes 30/28, the product of the betas of the npn and pnp transistors is less than one, and no current flows due to the reverse biasing of the pn junction between the n-type drift 12 and the p-well 14. The required dopant levels and layer thicknesses to create the desired betas may be determined by simulation.

When the gate voltage is sufficiently positive relative to the cathode voltage (e.g., 2-5 volts), electrons injected by the n+ type region 18 accumulate around the gates 24. This effectively extends the n+ type region 18 toward the right edge of the p-well 14 and thus reduces the base width of the npn transistor to width W2. The reduced base width increases the beta of the npn transistor so that the product of the betas of the npn and pnp transistors exceeds one. The initially small diffusion current gets rapidly amplified by feedback until the lateral current through the p-well 14 causes a voltage differential exceeding 0.6 volts across the npn transistor's emitter-base junction to turn on the npn transistor. Holes from the p+ type anode region 15 and electrons from the n+ type region 18 are increasingly injected into the p-well 14 and n− drift layer 12 until both the npn and pnp transistors are fully conducting to conduct current between the anode electrode 30 and the cathode electrode 28 with a voltage drop around 1.4 volts. The condition where such conduction happens is called breakover.

When the gates 24 are again shorted to the cathode electrode 28, or otherwise reduced below a turn-off threshold, the npn transistor base width again becomes wide (W1), and the product of the betas (now below one) can no longer sustain the current conduction. The device thus turns off. The threshold beta of the npn transistor needed to turn on the IGTO device may be higher than the threshold beta of the npn transistor needed to turn off the IGTO device, although they may be the same in certain embodiments.

The dopant levels and area dimensions are controlled to avoid latch-up at the operating current to allow the device to be turned on and off via the gates 24. This behavior is different from that of a conventional thyristor operation where latch-up is used during normal operation and gate turn-off is not possible.

Since the lateral feature dimensions are precisely controllable using masks, the base width dimensions are precisely controlled. Therefore, the turn-on voltage can be made repeatable from lot to lot. The trench depths of the lateral IGTO device can also be much shallower than those of the vertical IGTO device since the lateral dimensions, rather than the vertical dimensions, determine the breakdown voltage. Further, since the metallization is on top of the structure, it is much easier to electrically isolate the IGTO device and incorporate other circuits in the die, such as sensing and control circuits.

Although the lateral IGTO device described above (from U.S. Pat. No. 8,937,502) is considered to be the best performing high voltage/high current switch ever made, the Applicant still seeks to improve the device.

SUMMARY

In one embodiment, the Applicant improves on the lateral IGTO device described in U.S. Pat. No. 8,937,502. To improve the performance of the device, Applicant adds a second set of trenched gates that extend from the p+ emitter (anode side of the lateral device) and into the n− drift layer.

The first set of trenched gates, described with respect to the prior art, is the turn on/off gates that effectively reduce the base width of the npn lateral bipolar transistor to cause the product of the betas of the npn and npn transistors to exceed one to turn on the device. The first set of gates turns the device on when a positive voltage (relative to the n+ source/npn emitter) is applied to the first set of gates to form an inversion layer of electrons along the gate within the p− well.

The second set of gates, in accordance with the invention, is separately controlled and is connected to a second gate electrode. When a positive voltage is applied to the first set of gates to turn the device on (to form an electron inversion layer), a negative voltage (relative to the p+ source/pnp emitter) is applied to the second set of gates (to form a hole inversion layer) to effectively extend the p+ emitter (of the pnp transistor) into the n-drift layer. This effect is referred to as an induced p+ emitter, which reduces the base width of the pnp transistor to increase its beta and decrease its forward voltage drop.

When both sets of gates are biased with their respective turn-off voltages (to turn off the IGTO device), the n-drift layer depletes to support the high voltage between the anode and cathode. By effectively extending the p+ emitter into the n-drift layer, the n-drift layer can be made longer for increasing the breakdown voltage, while at the same time reducing the forward voltage drop by action of the second set of gates.

In another embodiment, an additional n-region is formed within the p-emitter of the pnp transistor, and the second set of gates extends from the additional n-region to into the n-drift layer. Part of the second set of gates also passes through the p+ emitter surrounding the additional n-region. To turn the device on, a positive voltage is applied to the first set of gates and a negative voltage is applied to the second set of gates, as previously described. To turn off the device, a negative is applied to the first set of gates to widen the base of the npn transistor and accumulate holes along the first set of gates, and a positive voltage is applied to the second set of gates to rapidly remove charge carriers from the n-drift layer to more rapidly turn the device off. The negative voltage applied to the first set of gates forms a p-channel to rapidly remove carriers within the p-well to more rapidly turn the device off. The turn-off voltages may be temporarily applied since the IGTO device will remain off.

Accordingly, in the second embodiment, there is a significant improvement in forward voltage drop and turn-off performance.

Other embodiments are described.

In addition to the dynamic control of the shorting of the n and p regions, other areas of n and p regions of the IGTO device may be directly shorted by the cathode electrode. The combination of direct shorting and dynamic shorting provides control of the turn-on and turn-off characteristics.

Figure 6:
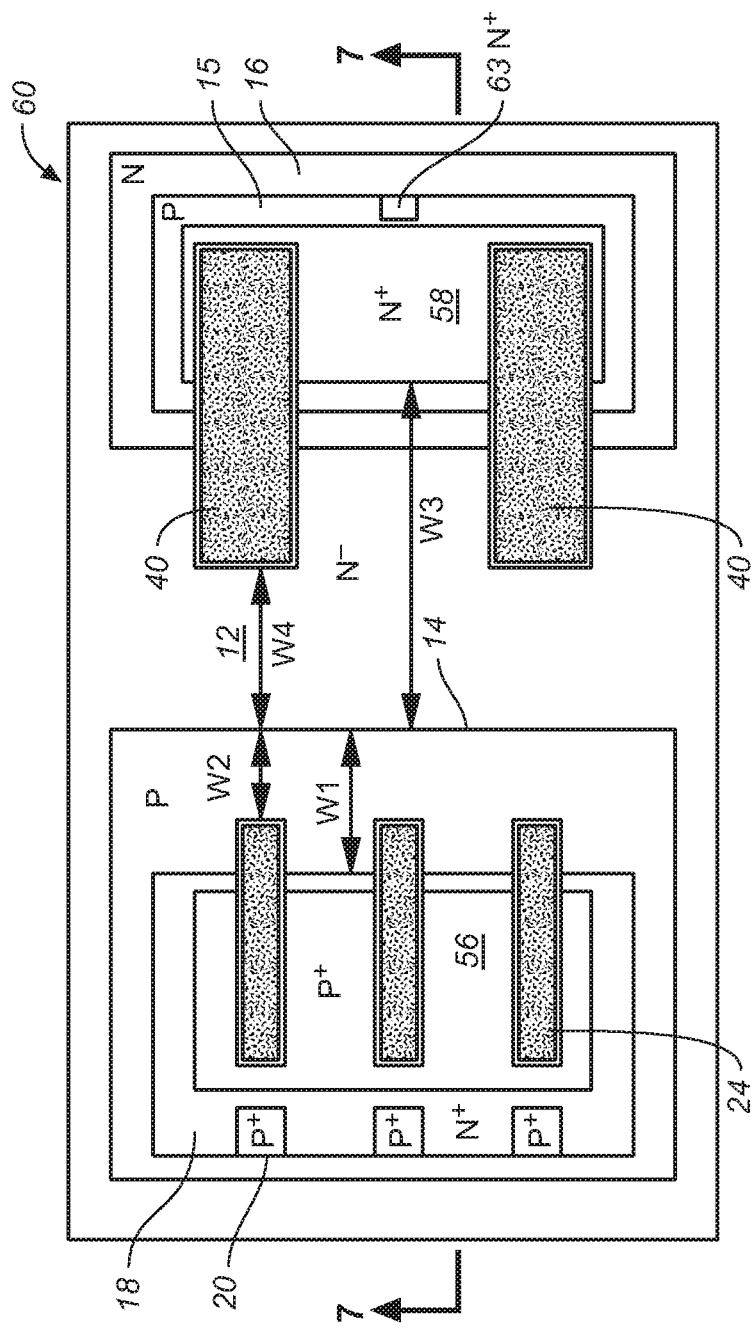
FIG. 6 is a top down view of a variation of the IGTO device of FIG. 4, where an additional n-region is formed within the p-emitter of the pnp transistor, and an additional p-region is formed within the n-emitter of the npn transistor, so that the n and p regions can be dynamically shorted together during turn off to rapidly withdraw charge carriers from the n-drift layer and the p-well when the device is turned off. The two sets of gates form portions of p-channel and n-channel MOSFETs, depending on their bias voltages during turn-on and turn-off.

FIG. 7 is a cross-sectional view along line 7-7 in FIG. 6.

FIG. 8 is a net dopant concentration profile along FIG. 7.

Elements that are similar or identical in the various figures are labeled with the same numeral.

DETAILED DESCRIPTION

Figures 1, 2, 3:
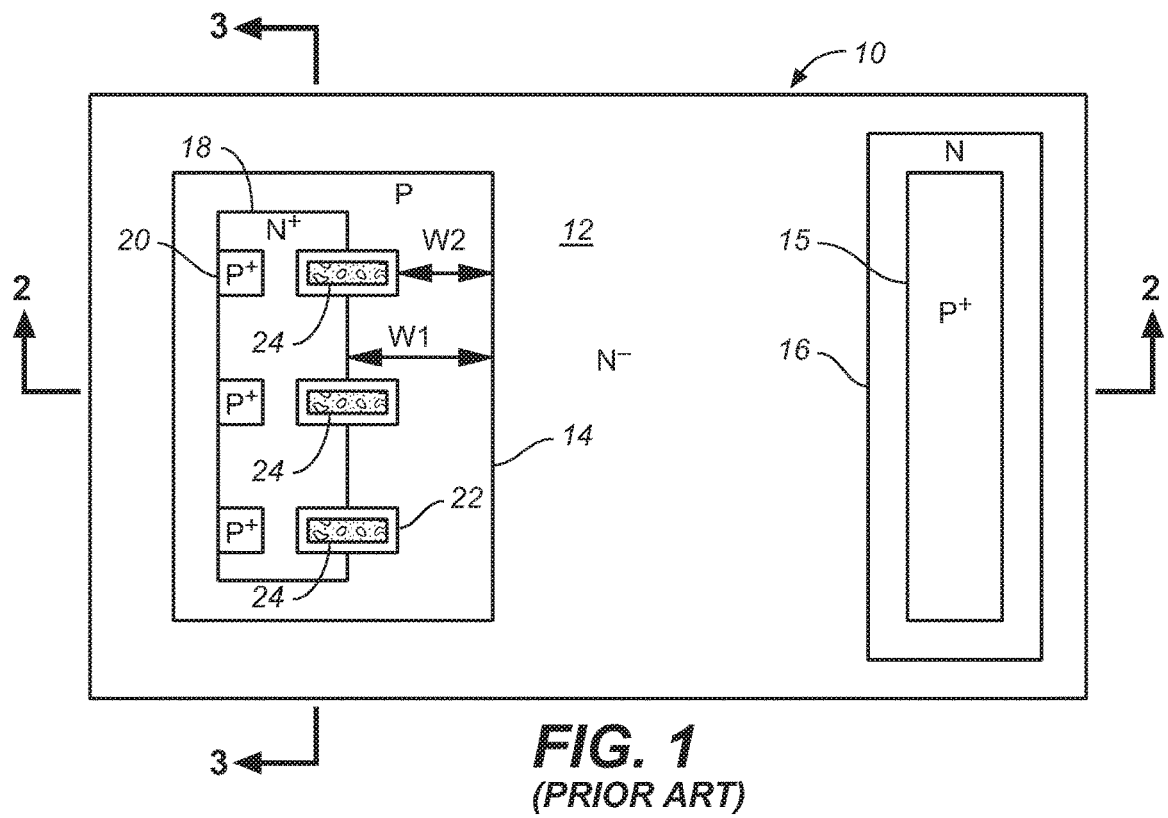
FIG. 1 is a top down view of Applicant's prior art lateral IGTO device.
FIG. 2 is a cross-sectional view along line 2-2 in FIG. 1.
FIG. 3 is a cross-sectional view along line 3-3 in FIG. 1.
Figure 4:
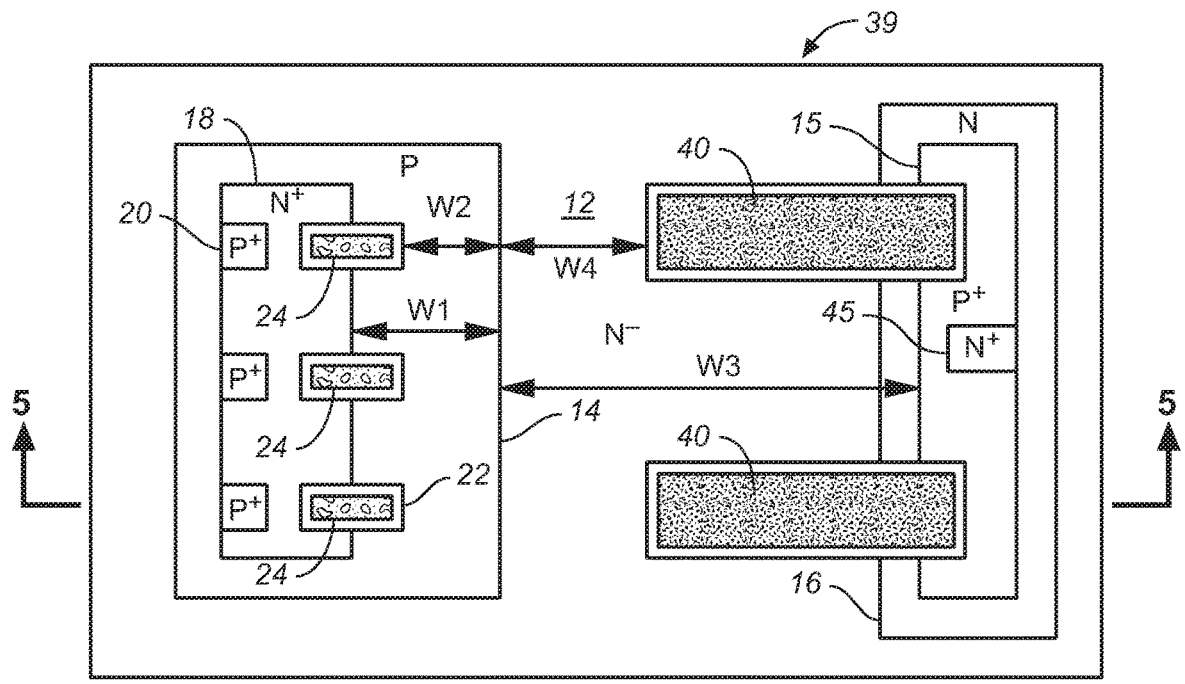
FIG. 4 is a top down view of an IGTO device having an induced p+ emitter, in accordance with one embodiment of the present invention.
Figure 5:
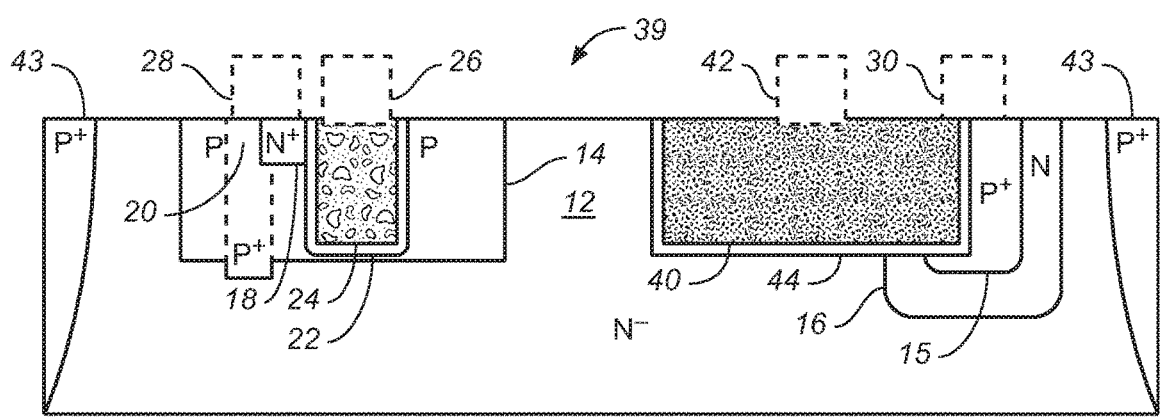
FIG. 5 is a cross-sectional view along line 5-5 in FIG. 4.

FIGS. 4 and 5 illustrate one embodiment of the inventive IGTO device 39 formed as a single die. All aspects of FIGS. 4 and 5 may be similar to the IGTO device of FIGS. 1-3 except as described below, so similar aspects will not be repeated.

The invention adds an array of parallel-connected trenched gates 40 extending between the p+ type anode region 15 and the n-drift layer 12 (the p+ type anode region 15 also acts as the emitter for the pnp transistor). The insulated gates 40 are electrically connected together at a gate electrode 42 (FIG. 5), which is separate from the gate electrode 26 for the gates 24.

FIG. 5 is a cross-section along line 5-5 in FIG. 4 and shows the gate oxide 44 insulating the gate 40 (doped polysilicon). A p+ sinker 43, surrounding the n-drift layer 12, is added for isolation of the n-drift layer 12. The trenches for the gates 24 and 40 may be formed at the same time so have the same depths, but having the same depths is not necessary. The trenches, gate oxide 44, and gate polysilicon for the gates 24 and 40 may be concurrently formed using the same masks, etc. for ease of fabrication.

The gates 24 are the turn on/off gates that effectively reduce the base width of the npn lateral bipolar transistor from width W1 to width W2 to cause the product of the betas of the npn and pnp transistors to exceed one to turn on the device. The gates 24 turn the device on when a positive voltage (relative to the n+ type region 18) is applied to the gates 24 to form an inversion layer of electrons along the gates 24 within the p-well 14. The n+ type region 18 acts as a source/npn emitter. The gates 24 form a partial n-channel MOSFET since conduction electrons adjacent to the gate 24 form a conducting path, although the path does not bridge two n-regions.

When a positive voltage is applied to the gates 24 to turn the device on (to form an electron inversion layer), a negative voltage (relative to the p+ anode region 15/pnp emitter) is applied to the gates 40 to form a hole inversion layer in the n-drift layer 12 to effectively extend the p+ emitter of the pnp transistor into the n-drift layer 12 (forming an induced emitter). This reduces the base width of the pnp transistor from width W3 to width W4. The inverted area around the gates 40 form a p-channel that extends into the n-drift layer 12. This reduced base width of the pnp transistor increases its beta and reduces the forward voltage drop. By the action of the gates 24 and 40 increasing the betas of the npn and pnp transistors, turn-on time is also reduced. The gates 40 form a partial p-channel MOSFET since holes along the gate 40 form a conducting path, although the path does not bridge two p-regions.

When respective turn-off voltages are applied to the gates 24 and 40 and the IGTO device 39 is turned off, the n-drift layer 12 depletes to support the high voltage between the anode and cathode. By effectively extending the p+ emitter (p+ anode region 15) into the n-drift layer 12, the n-drift layer 12 can be made longer for increasing the breakdown voltage, while at the same time reducing on-resistance by action of the gates 40.

When turning the IGTO device 39 off, the gate 40 may optionally be temporarily driven positive to accumulate free electrons along the gate 40, which forms a lower resistance path between the n-drift layer 12 and the n-type buffer well 16 to speed up the removal of electron carriers from the n-drift layer 12. The anode electrode 30 (at a positive voltage) removes the current carriers from the n-type buffer well 16.

As seen in FIG. 5, the cathode electrode 28 directly shorts the n+ type region 18 (n+ emitter of the npn transistor) to the p-well 14. When the gate 24 is biased high, the current flows through the inversion layer in the p-well 14 with a low resistance, and there is a voltage drop through the p-well 14 sufficient to turn on the base-emitter diode of the npn transistor to begin the regenerative action of the IGTO device. The number and locations of these base-emitter shorts affect the electrical performance of the IGTO device, since fewer shorts (or shorting areas) effectively increase the voltage drop through the p-well 14 to turn on the pnp transistor with a lower current. However, more shorts (or a higher shorting area) rapidly withdraw hole carriers from the p-well 14 when turning the IGTO device 39 off. Therefore, it is desirable to dynamically control the shorting to be different during turning on of the IGTO device and turning off of the IGTO device.

FIG. 4 also shows an n+ region 45 extending from the n-type buffer well 16 into the p+ anode region 15. The metal anode electrode 30 directly contacts the n+ region 45 and the p+ anode region 15 to weakly short the n-drift layer 12 to the anode electrode 30 to remove carriers from the n-drift layer 12 when the device is turned off. The cross-section of FIG. 5 does not cut across the n+ region 45, so only the contact to the p+ anode region 15 is shown in FIG. 5.

FIG. 6 shows another embodiment of the invention, with an added p-type region 56 inside the n+ type region 18 and an added n-type region 58 within the p+ anode region 15. This results in the gates 24 and 40 also being used for dynamically shorting n and p type regions together during the turning off of the IGTO device 60 to more rapidly remove free charge carriers from the n-drift layer 12 and the p-well 14.

Some shorts may be by direct contact with the cathode electrode 28 and some shorts are controlled by a p-channel MOSFET (formed by the gates 24 being negatively biased when turning the IGTO device off) and an n-channel MOSFET (formed by the gates 40 being positively biased when turning the IGTO device off). The MOSFETs' threshold voltages are determined by the peak dopant concentration in their body regions. The dynamic shorting of the p and n regions rapidly removes current carriers to more rapidly turn off the IGTO device 60, while there is no shorting by the MOSFETs when the IGTO device is on, so that there is an adequate voltage drop across the p-well 14 to turn on the npn transistor.

The gates 24 in FIG. 6 perform the same function when the IGTO device 60 is turning on, since the inversion layer along the gates 24 effectively extends the n+ type region 18 (emitter of npn transistor) further into the p-well 14 to reduce the base width of the npn transistor to increase its beta (to begin regenerative action by the IGTO device 60). However, when turning off the IGTO device 60, the gates 24 can be driven to a negative voltage to form a hole inversion layer in the n+ type region 18 to form a conductive channel between the p-well 14 and the p-type region 56. Although not shown in FIG. 7, the cathode electrode directly shorts the n+ type region 18 and the p-type region 56 and only weakly shorts the p-well 14 via the p+ regions 20, so the holes in the p-well 14 during turning off are rapidly removed by the cathode electrode 28 (coupled to a negative voltage). The cathode electrode weakly shorts the n+ type region 18 to the p-well 14 so there is a sufficient voltage drop across the p-well 14 when turning on the IGTO device 60 to turn on the npn transistor. This is similar to the cathode electrode 28 connection in FIG. 2.

Similarly, the gates 40 perform the same function as the gates 40 in FIG. 4 when turning on the IGTO device 60, when a negative voltage is applied to the gates 40. When turning off the IGTO device 60, the gates 40 are positively biased to form an n-channel MOSFET that forms a conductive channel between the n-drift layer 12 and the added n-type region 58. The n-type region 58 is effectively isolated from the other regions when the IGTO device 60 is on, since the gates 40 are negatively biased and there is no conduction path between the n-type region 58 and any other region.

The gate electrodes for the gates 24 and 40 in FIG. 6 are similar to the gate electrodes 26 and 42 shown in FIG. 5.

FIG. 6 also shows an n+ region 63 extending from the n-type buffer well 16 into the p+ anode region 15. The metal anode electrode directly contacts the n+ region 58 and the p+ anode region 15 and only weakly shorts the p+ anode region 15 to the n-type buffer well 16 via the n+ region 63, so the anode electrode removes carriers from the n-drift layer 12 when the device is turned off.

Accordingly, the 4-terminal device of FIG. 6 can be dynamically controlled at optimal times to cause a very rapid turn-on and turn-off of the IGTO device 60.

FIG. 7 is a cross-section along lines 7-7 in FIG. 6 showing the relative locations and depths of various regions. No metallization is shown. P+ sinker 64 surrounds and extends through the n-drift layer 12 for isolating the device from other devices formed in the n-drift layer 12.

FIG. 8 illustrates relative dopant concentrations of the regions in FIG. 7.

In another embodiment, only one of the sets of gates 24 or 40 in FIG. 4 or 6 may be formed for turning the IGTO device off by expanding the base width of either the npn or pnp transistor (to reduce the beta), or by extracting carriers by biasing the MOSFET on to short the base of one of the npn or pnp transistors to ground or the anode voltage.

The various embodiments are simplified examples, and high voltage devices may employ features with rounded edges to avoid field crowding. The required voltages and currents will determine the sizes of the devices. The devices may be formed with an array of identical cells or strips that are connected in parallel. Circular or semicircular geometries with the n+ source/emitter and the p+ anode in the center may also be used.

Although the addition of the trenches on the anode side may reduce the breakdown voltage by removing a portion of the n-drift layer 12, this can be compensated for by increasing the thickness of the n-drift layer 12. Larger or more emitters can be used to decrease the forward voltage (the on-voltage drop).

In one embodiment, a load, such as a motor, has one terminal connected to ground and a second terminal connected to the cathode electrode of the IGTO device, while the anode electrode is connected to a positive voltage of a power supply.

Any features described may be combined together.

The IGTO devices in any of the figures may have the anode and cathode reversed by reversing the polarities of the materials.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A lateral insulated gate turn-off (IGTO) device formed as a die comprising:
   a first semiconductor layer of a first conductivity type;
   a well of a second conductivity type formed in the first semiconductor layer;
   a first region of the first conductivity type formed in the well and shallower than the well;
   a first electrode electrically contacting the first region;
   at least one trenched first gate extending along the first region and into the well, the first gate not extending outside of the well, the at least one trenched first gate being connected to a first gate electrode;

a second region of the second conductivity type formed in the first semiconductor layer and laterally spaced from the well;
a second electrode electrically contacting the second region; and
at least one trenched second gate extending along the second region and into the first semiconductor layer, the at least one trenched second gate being connected to a second gate electrode;
wherein a lateral structure of npn and pnp transistors is formed, and wherein the well forms a first base of one of the transistors,
the well having dimensions and a dopant concentration such that, when a forward biasing voltage is applied between the first electrode and the second electrode and when a first turn-on voltage is applied to the first gate electrode, the at least one trenched first gate creates a first inversion layer in the well to turn on the IGTO device to conduct a lateral current between the first electrode and the second electrode, and
wherein the at least one trenched second gate is configured so that when a second turn-on voltage, different from the first turn-on voltage, is applied to the second gate electrode, the at least one trenched second gate creates a second inversion layer in the first semiconductor layer that extends between the second region and the first semiconductor layer.

2. The device of claim 1 further comprising a third region of the second conductivity type formed in the well and shallower than the well, the third region having a dopant concentration higher than a dopant concentration of the well.

3. The device of claim 2 wherein the third region is shorted to the first region by the first electrode.

4. The device of claim 1 wherein,
when the first turn-on voltage is applied to the first gate electrode, the first gate creates the first inversion layer in the well to cause the first base to have a reduced width, resulting in the beta of the one of the transistors to increase beyond a first threshold to turn on the IGTO device to conduct the lateral current between the first electrode and the second electrode, and
wherein, when a first turn-off voltage is applied to the first gate electrode, the first base has an increased width to cause the beta of the one of the transistors to be reduced below a second threshold to turn off the IGTO device.

5. The device of claim 1 wherein, when the at least one trenched second gate creates the second inversion layer in the first semiconductor layer that extends between the second region and the first semiconductor layer, the second inversion layer effectively extends an emitter of one of the transistors into the first semiconductor layer.

6. The device of claim 1 further comprising a third region of the second conductivity type formed within the first region, wherein the at least one trenched first gate extends between the third region and the well, with a portion of the first region between the third region and the well.

7. The device of claim 6 wherein the at least one trenched first gate is configured so that, during turning off the IGTO device, a first turn-off voltage applied to the first gate electrode forms a third inversion layer to electrically connect the well to the third region to remove carriers from the well.

8. The device of claim 1 further comprising:
a third region of the first conductivity type within the second region,
wherein the at least one trenched second gate is configured so that, during turning off the IGTO device, a first turn-off voltage applied to the second gate electrode forms a third inversion layer to electrically connect the first semiconductor layer to the third region to remove carriers from the first semiconductor layer.

9. The device of claim 1 wherein the at least one trenched first gate comprises a plurality of trenched first gates, and the at least one trenched second gate comprises a plurality of trenched second gates.

10. The device of claim 1 wherein the first semiconductor layer is a drift layer.

11. The device of claim 1 wherein the first semiconductor layer comprises a substrate.

12. The device of claim 1 wherein the first semiconductor layer comprises a layer grown on a substrate.

13. The device of claim 1 wherein the first semiconductor layer comprises an isolated well of the first conductivity type.

14. The device of claim 1 wherein the first conductivity type is an n-type and the second conductivity type is a p-type.

15. The device of claim 1 wherein
the device has four electrodes on its top surface comprising the first electrode, the second electrode, the first gate electrode, and the second gate electrode,
wherein the device is configured such that the first turn-on voltage applied to the first gate electrode forms an n-channel along the at least one trenched first gate, and
wherein the device is configured such that the second turn-on voltage applied to the second gate electrode forms a p-channel along the at least one trenched second gate.

16. The device of claim 15 further comprising:
a third region of the second conductivity type formed within the first region, wherein the at least one trenched first gate extends between the third region and the well, with a portion of the first region between the third region and the well, wherein the at least one trenched first gate is configured so that, during turning off the IGTO device, a first turn-off voltage applied to the first gate electrode forms a third inversion layer to electrically connect the well to the third region to remove carriers from the well; and
a fourth region of the first conductivity type within the second region, wherein, the at least one trenched second gate is configured so that, during turning off the IGTO device, a second turn-off voltage applied to the second gate electrode forms a fourth inversion layer to electrically connect the first semiconductor layer to the fourth region to remove carriers from the first semiconductor layer.

17. The device of claim 16 wherein
the device is configured such that the first turn-off voltage applied to the first gate electrode forms a p-channel along the at least one trenched first gate, and
wherein the device is configured such that the second turn-off voltage applied to the second gate electrode forms an n-channel along the at least one trenched second gate.

18. A method of controlling a lateral insulated gate turn-off (IGTO) device formed as a die, the lateral IGTO device comprising a first semiconductor layer (12) of a first conductivity type, a well (14) of a second conductivity type formed in the first semiconductor layer, a first region (18) of the first conductivity type formed in the well and shallower than the well, a first electrode (28), at least one trenched first gate (24) extending along the first region (18) and into the well (14), the first gate (24) not extending outside of the well (14), a second region (15) of the second conductivity type formed in the first semiconductor layer (12) and laterally spaced from the well (14), a second electrode (30) electrically contacting the second region (15), at least one trenched second gate (40) extending along the second region (15) and into the first semiconductor layer (12), wherein a lateral structure of npn and pnp transistors is formed, and wherein the well forms a first base of one of the transistors, the method comprising:

applying a forward biasing voltage between the first electrode and the second electrode;

applying a first turn-on voltage to the first gate, causing the first gate to create a first inversion layer in the well to turn on the IGTO device to conduct a lateral current between the first electrode and the second electrode;

applying a second turn-on voltage to the second gate, different from the first turn-on voltage, causing the second gate to create a second inversion layer in the first semiconductor layer;

applying a first turn-off voltage to the first gate to turn off the IGTO device; and applying a second turn-off voltage to the second gate, different from the first turn-off voltage.

19. The method of claim 18 wherein the first turn-on voltage forms an n-channel inversion layer along the first gate, the second turn-on voltage forms a p-channel inversion layer along the second gate, the first turn-off voltage forms a p-channel along the first gate, and the second turn-off voltage forms an n-channel along the second gate.

20. The method of claim 18 wherein applying the first turn-on voltage to the first gate increases a beta of one of the npn and pnp transistors.

\* \* \* \* \*